United States Patent [19]
Hashizume et al.

[11] Patent Number: 5,245,158
[45] Date of Patent: Sep. 14, 1993

[54] SEMICONDUCTOR DEVICE MANUFACTURING APPARATUS

[75] Inventors: Yasushi Hashizume; Mitsuhiro Tomikawa, both of Itami, Japan

[73] Assignee: Mitsubishi Denki Kabushiki Kaisha, Tokyo, Japan

[21] Appl. No.: 767,684

[22] Filed: Sep. 30, 1991

[30] Foreign Application Priority Data

Jan. 17, 1991 [JP] Japan .................................. 3-015679

[51] Int. Cl.⁵ ........................ F27D 15/02; H01L 21/22
[52] U.S. Cl. ..................................... 219/390; 392/416; 392/418; 118/724; 432/239; 414/150
[58] Field of Search ............... 219/390, 405, 411, 385; 392/416, 418; 118/724, 725, 729, 50.1; 432/239; 414/150

[56] References Cited

U.S. PATENT DOCUMENTS

| | | | |
|---|---|---|---|
| 3,385,921 | 5/1968 | Hampton | 219/390 |
| 4,526,534 | 7/1985 | Wollmann | 219/390 |
| 4,543,059 | 9/1985 | Whang | 219/390 |
| 4,573,431 | 3/1986 | Sarkozy | 219/390 |
| 4,610,628 | 9/1986 | Mizushima | 432/241 |
| 4,766,678 | 8/1988 | Yanase | 34/229 |
| 4,938,691 | 7/1990 | Ohkase et al. | 432/239 |
| 4,954,684 | 9/1990 | Aoki et al. | 219/390 |
| 4,957,781 | 9/1990 | Kanegae | 427/255.3 |
| 5,000,682 | 7/1991 | Heidt et al. | 432/239 |
| 5,080,039 | 1/1992 | Kanegae | 219/390 |

FOREIGN PATENT DOCUMENTS

| | | |
|---|---|---|
| 61-260624 | 11/1986 | Japan .................. 219/411 |
| 62-45020 | 2/1987 | Japan . |
| 62-269313 | 11/1987 | Japan . |
| 63-133520 | 6/1988 | Japan . |
| 63-146437 | 6/1988 | Japan . |
| 2-73625 | 3/1990 | Japan . |
| 2-248039 | 3/1990 | Japan . |
| 3-194933 | 8/1991 | Japan . |

*Primary Examiner*—Bruce A. Reynolds
*Assistant Examiner*—John A. Jeffery
*Attorney, Agent, or Firm*—Leydig, Voit & Mayer

[57] ABSTRACT

A semiconductor device manufacturing apparatus has a heat retaining tube which can be freely placed in and pulled out of a processing chamber of the apparatus. When located within the processing chamber, the heat retaining tube surrounds a boat with the semiconductor wafers mounted thereon. After the thermal processing of the semiconductor wafers has been completed, the heat retaining tube and the semiconductor wafers are pulled out of the processing chamber together. In this way, the difference in the temperature of the center and periphery of the semiconductor wafer is decreased, and semiconductor devices, which have excellent performance and which are free from crystalline defects or dislocation, can thus be manufactured.

7 Claims, 6 Drawing Sheets

SEMICONDUCTOR DEVICE MANUFACTURING APPARATUS

BACKGROUND OF THE INVENTION

1. Field of the Invention

The present invention relates to a semiconductor device manufacturing apparatus for heat processing of semiconductor wafers and a method of controlling the semiconductor device manufacturing apparatus.

2. Description of the Related Art

FIG. 8 is a schematic view of a conventional semiconductor device manufacturing apparatus, for example, a diffusion furnace. In FIG. 8, a heater 2 is disposed on the outside of a cylindrical processing chamber 1 made of quartz. The cylindrical processing chamber 1 has an opening at its lower end. An upper portion of the processing chamber 1 is provided with a gas introducing port 4. Within the processing chamber 1, a plurality of semiconductor wafers are supported on, for example, a boat 5 made of quartz. The boat 5 is placed on a boat base 6, which is connected to a boat loader 7. The boat 5 is fed in and out of the processing chamber 1 by the vertical movement of the boat loader 7.

The conventional semiconductor device manufacturing apparatus arranged in the manner described above is operated as follows: first, the semiconductor wafers 3 to be heated are placed on the boat 5, and that boat is placed in the processing chamber 1 by means of the boat loader 7. Thereafter, the semiconductor wafers 3 are heated by the heater 2 while a gas, such as oxygen or nitrogen, is supplied from the gas introducting port 4, when necessary. After heating has been conducted for a desired period of time and at a desired temperature, the boat 5 is pulled out of the processing chamber 1 by means of the boat loader 7.

Generally, the semiconductor wafers 3 are pulled out of the processing chamber 1 at a very high temperature ranging from 800° C. to 900° C., because it takes long time for the temperature of the diffusion furnace to decrease due to the large heat capacity thereof and pulling out of the semiconductor wafers 3 at a low temperature lengthens the processing time and thus reduces productivity.

Once pulled out of the high temperature processing chamber 1, the semiconductor wafers 3 begin to cool starting from the periphery thereof. FIG. 9 is a graph showing how the temperature of the wafers behaves at various temperatures of the processing chamber 1 when the wafers are pulled out of the chamber. The abscissa represents the temperature of the center of the semiconductor wafer 3, and the ordinate represents the difference in the temperature between the center of and the periphery of the semiconductor wafer 3. In the graph, curves A, B, and C respectively show the behavior of the temperature of the semiconductor wafers 3 when the wafers are pulled out of the chamber 1 at 800° C., 850° C. and 900° C. As can be seen from the graph, there is a difference in the temperature between the center and the periphery of the semiconductor wafer 3. That temperature difference generates stress. When the temperature of the processing chamber 1 is high and the temperature difference within the semiconductor wafer 3 is large, crystalline defects or dislocation occur to a degree which cannot be repaired. The region where defects or dislocation occur is represented in FIG. 9 by area D. The graph shown in FIG. 9 is just an example, and the temperature difference increases where the semiconductor wafer 3 has a larger diameter or where the pulling rate of the semiconductor wafers 3 is higher.

In the semiconductor device manufacturing apparatus of the type described above, the difference in the temperature between the center and periphery of the semiconductor wafer 3 is great when the semiconductor wafer is pulled out of the processing chamber 1, generating crystalline defects or dislocations and thereby adversely affecting the quality of the semiconductor wafer 3.

SUMMARY OF THE INVENTION

Accordingly, an object of the present invention is to provide a semiconductor device manufacturing apparatus in which the in-plane temperature differential of a semiconductor wafer remains small when the semiconductor wafer is pulled out of a processing chamber to eliminate generation of crystalline defects or dislocations in the semiconductor wafer.

Another object of the present invention is to provide a method of controlling such a semiconductor device manufacturing apparatus.

In order to achieve the above objects, according to one aspect of the present invention, there is provided a semiconductor device manufacturing apparatus which comprises a processing chamber for thermal processing of semiconductor wafers, a heater disposed on the outside of the processing chamber for heating, a jig for holding, the plurality of semiconductor wafers and guiding the wafers into and out of the processing chamber, and a heat retaining tube that can be placed in and pulled out of the processing chamber independently from the jig surrounding the semiconductor wafers.

According to another aspect of the present invention, there is provided a method of controlling a semiconductor device manufacturing apparatus which comprises the steps of placing a heat retaining tube in a processing chamber and heating the interior of the processing chamber, placing a boat with semiconductor wafers placed thereon in the processing chamber thermally processing the semiconductor wafers, pulling the heat retaining tube and the boat and the semiconductor wafers out of the processing chamber at the same time, and removing the heat retaining tube from the vicinity of the semiconductor wafers when the temperature of the semiconductor wafers has reached a predetermined value.

DESCRIPTION OF THE PREFERRED EMBODIMENT

Figure 1:
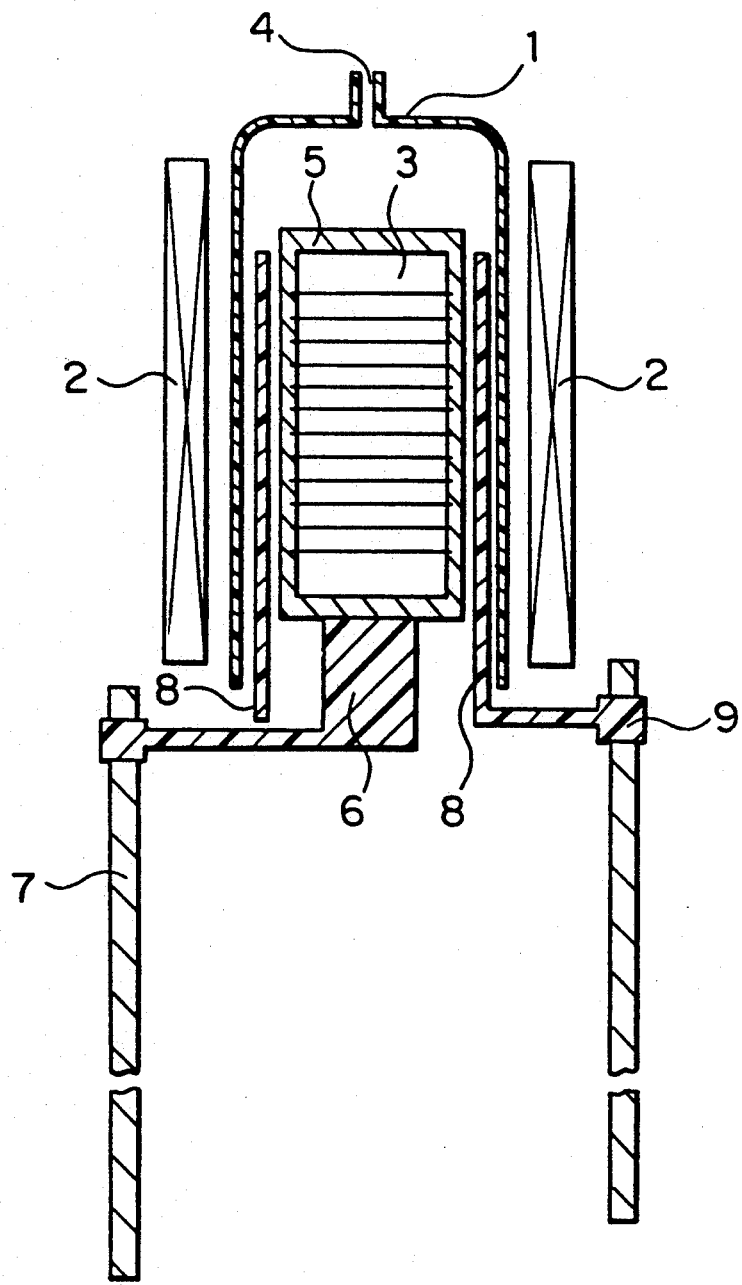
FIG. 1 is a cross-sectional view of an embodiment of a semiconductor device manufacturing apparatus according to the present invention.
Figure 8:
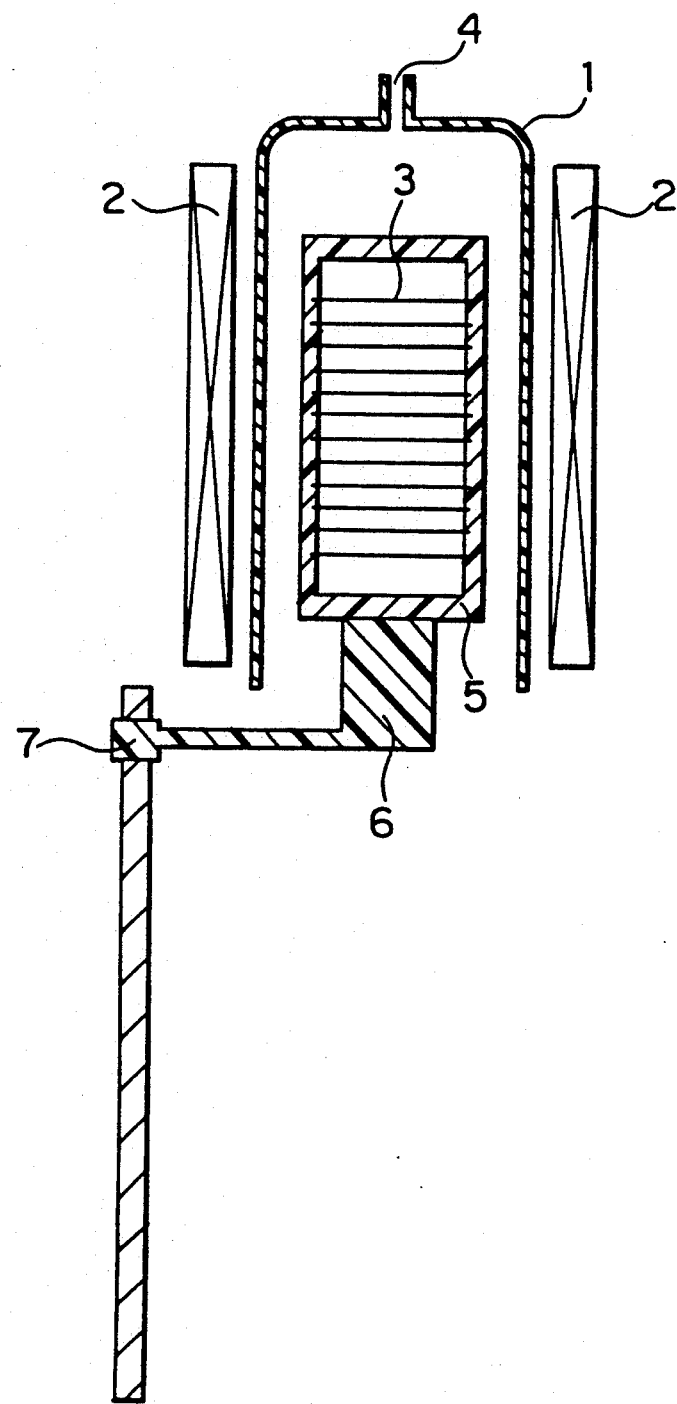
FIG. 8 is a cross-sectional view of a conventional semiconductor device manufacturing apparatus.
Figure 9:
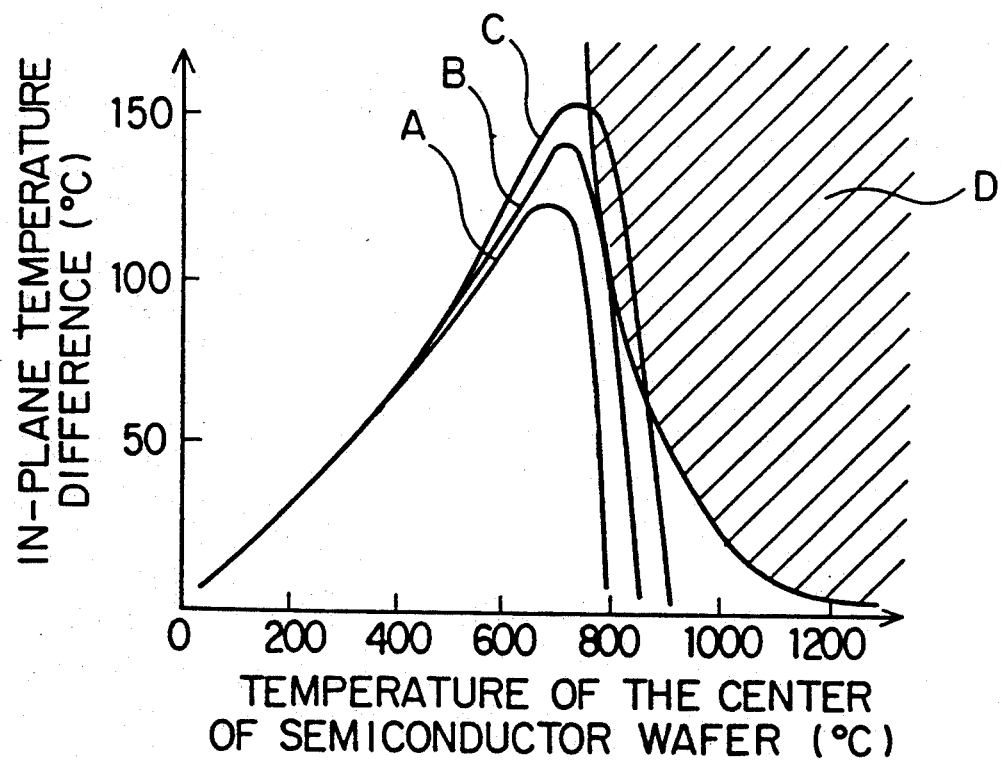
FIG. 9 is a graph showing the relationship between the temperature of the center of a semiconductor wafer and the difference in the in-plane temperature thereof.

FIG. 1 is a cross-sectional view of an embodiment of a semiconductor device manufacturing apparatus according to the present invention. In FIG. 1, reference numerals 1 to 7 denote parts which are the same as those of the conventional semiconductor device manufacturing apparatus shown in FIG. 8. In this semiconductor device manufacturing apparatus, a means for retaining the heat of the semiconductor wafers 3, e.g., a heat retaining tube 8, is provided around the boat 5. The heat retaining tube 8 is made of, for example, quartz. The heat retaining tube 8 is attached to a heat retaining tube loader 9 for inserting the heat retaining tube 8 into and for pulling the heat retaining tube 8 out of the processing chamber by means of a driving mechanism (not shown). The heat retaining tube 8 has at least a length which ensures that it surrounds all of the semiconductor wafers. Both of the boat loader 7 and the heat retaining tube loader 9 are accessible from outside the chamber 1 when the boat 5 and the heat retaining tube 8 are disposed within the chamber 1.

Figure 2:
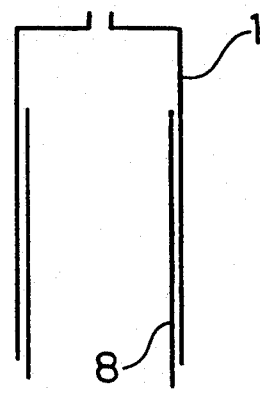
FIGS. 2-5 are schematic views illustrating a method of controlling a semiconductor device manufacturing apparatus according to the present invention.
Figure 3:
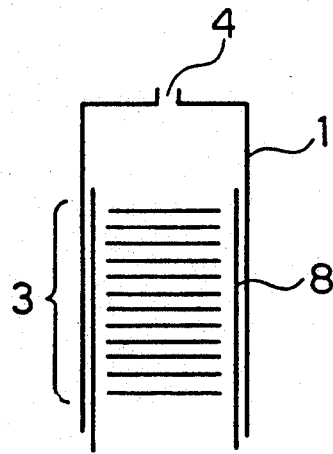
Figure 7:
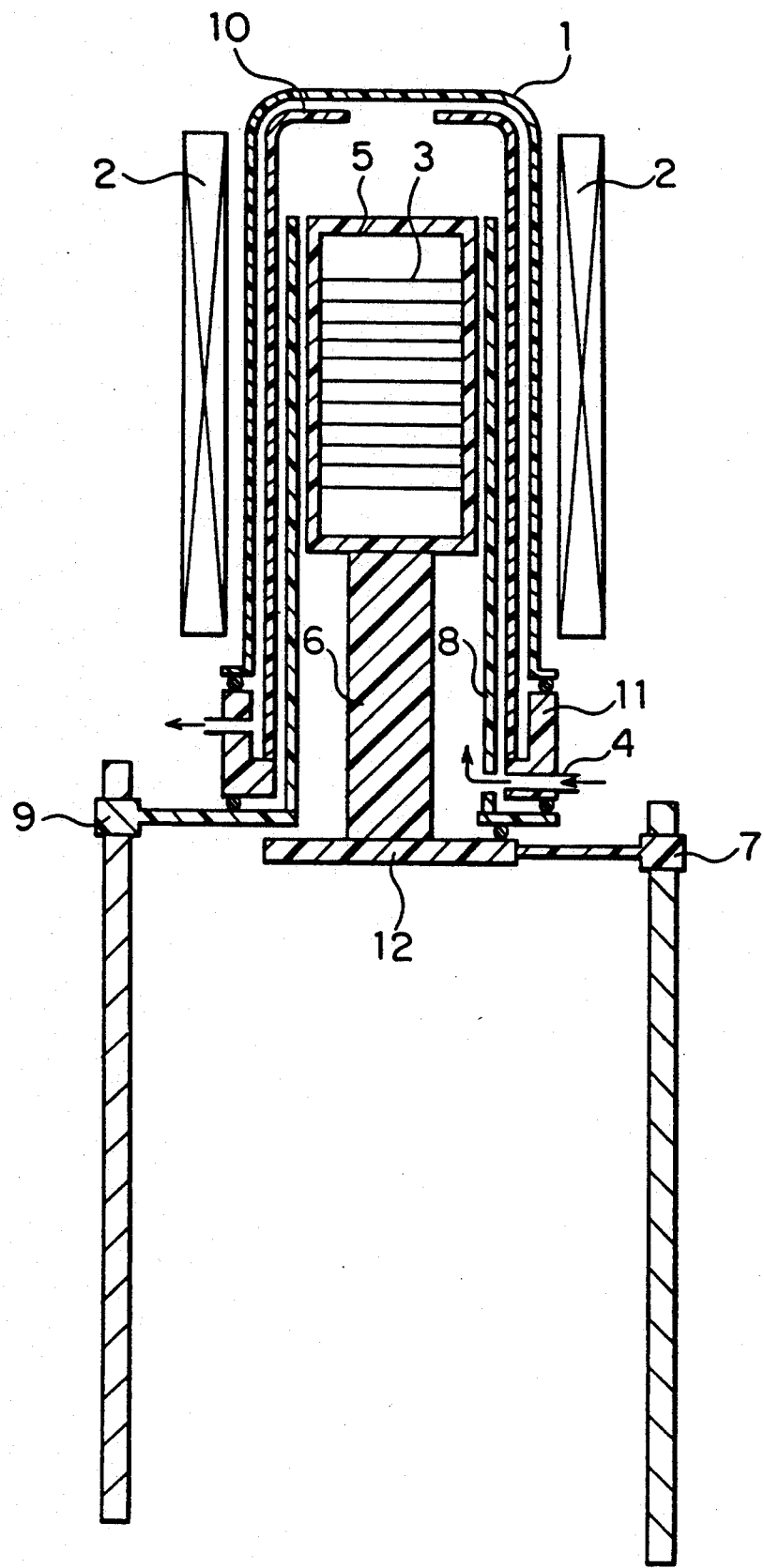
FIG. 7 is a cross-sectional view of still another embodiment of a semiconductor device manufacturing apparatus according to the present invention.

The semiconductor device manufacturing apparatus is operated in the manner described below: first, the semiconductor wafers 3 to be heated are placed on the boat 5. At that time the heat retaining tube 8 has already been inserted into the processing chamber 1 with the heat retaining tube loader 9, as indicated in FIG. 2. The heat retaining tube 8 is placed in the processing chamber 1 before the insertion of the boat in the chamber 1 because concurrent insertion of the heat retaining tube 8 and boat 5 reduces the internal temperature of the processing chamber 1 due to the large heat capacity of the heat retaining tube 8. Next, the boat 5 with the semiconductor wafers 3 mounted thereon is inserted into the processing chamber 1 by means of the boat loader 7, as shown in FIG. 7. In FIG. 3, the boat 5 and boat loader 7 are omitted. Thereafter, the semiconductor wafers 3 are heated by means of the heater 2 (not shown) while a gas, such as oxygen or nitrogen, is supplied from the gas introducing port 4, when necessary.

Figure 4:
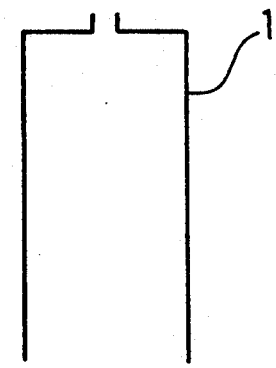
Figure 5:
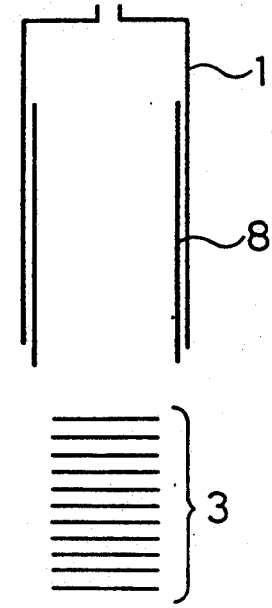
Figure 6:
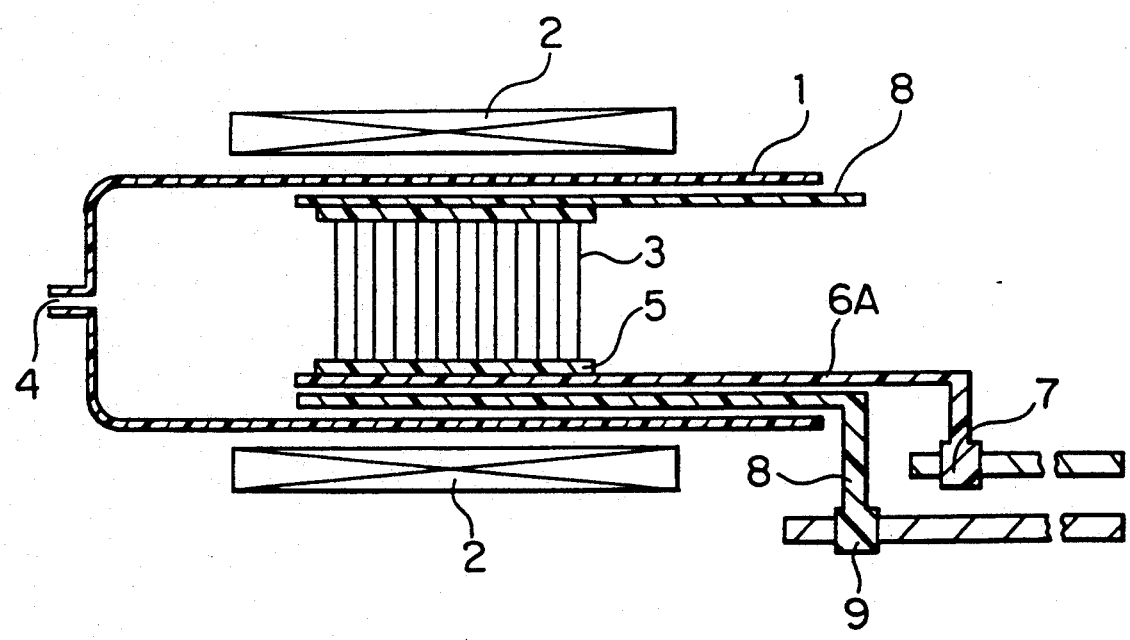
FIG. 6 is a cross-sectional view of another embodiment of a semiconductor device manufacturing apparatus according to the present invention.

After the heating has been conducted for a desired period of time and at a desired temperature, the boat 5 is pulled out of the processing chamber 1 by means of the boat loader 7. At that time, the heat retaining tube 8 is also pulled out of the processing chamber 1 by means of the heat retaining tube loader 9, together with the boat 5, as shown in FIG. 4. When the boat 5 and the heat retaining tube 8 are pulled out of the processing chamber 1 concurrently, the rate at which the temperature of the peripheral portion of the semiconductor wafer 3 drops is decreased because of the radiant heat emitted from the heat retaining tube 8. An increase in the difference in the temperature between the periphery and center of the semiconductor wafers 3 is thus suppressed. When the temperature of the semiconductor wafers 3 has dropped to about 700° C., i.e., outside area D shown in FIG. 5 so that crystalline defects or dislocations do not occur in the semiconductor wafers 3, the heat retaining tube 8 is returned to the processing chamber 1 by means of the heat retaining tube loader 9, as shown in FIG. 5. The semiconductor wafers 3 can be taken out of the processing chamber 1 when the, temperature thereof has decreased to a value outside the area D of FIG. 5, even through they are not cooled completely, and this shortens the processing time. Next, the semiconductor wafers 3 are unloaded from the boat 5 when they have sufficiently cooled.

In the above-described embodiment, a vertical type processing chamber 1 is used. However, a horizontal type processing chamber 1, such as that shown in FIG. 5, may also be used. At that time, a cantipaddle 6A is used in place of the boat base 6.

In the aforementioned embodiment, a diffusion furnace has been described. However, the present invention is not so limited, but can be applied to any heating apparatus having a cylindrical processing chamber, such the vacuum vapor-phase apparatus shown in FIG. 7. The vapor-phase apparatus shown in FIG. 7 has an inner tube 10 and a flange 11 within the processing chamber 1 for vacuum evacuation. The boat base 6 is retained by a door 12. As in FIG. 7, the heat retaining tube 8 and the inner tube 10 are individual components with separate loaders. However, a heat retaining tube which includes both functions may also be provided.

In the above-described embodiment, the heat retaining tube 8 is made of quartz. However, it can be made of any substance which does not affect the semiconductor wafers 3 during heating, e.g., which does not supply impurities. For example, a heat retaining tube 8 made of SiC or Si may be used.

Furthermore, in the above-described embodiment, the heat retaining tube 8 is placed in the processing chamber 1 before the semiconductor wafers 3 are placed in the chamber 1. However, the heat retaining tube 8 and the semiconductor wafers 3 may be inserted into the processing chamber 1 simultaneously. At that time, a decrease in the internal temperature of processing chamber 1 can be avoided by adjustment of the power source of the heater 2.

What is claimed is:

1. A semiconductor device manufacturing apparatus comprising:

a processing chamber for thermal processing of semiconductor wafers;

a heater disposed outside of said processing chamber for heating said chamber;

a boat for holding a plurality of semiconductor wafers and a loader attached to said boat for guiding said boat into and out of said processing chamber, said loader being accessible outside said processing chamber when said boat is disposed within said processing chamber;

a heat retaining tube insertable into and withdrawable from said processing chamber independently of and in concert with said boat for surrounding the boat holding a plurality of semiconductor wafers within and outside said processing chamber; and a heat retaining tube loader attached to said heat retaining tube and accessible outside said processing chamber when said heat retaining tube is disposed within said processing chamber.

2. A semiconductor device manufacturing apparatus according to claim 1, wherein said heat retaining tube has a length for surrounding all semiconductor wafers held in said boat.

3. A semiconductor device manufacturing apparatus according to claim 1, wherein said heat retaining tube is quartz.

4. A semiconductor device manufacturing apparatus according to claim 1, wherein said heat retaining tube is SiC.

5. A semiconductor device manufacturing apparatus according to claim 1, wherein said heat retaining tube is Si.

6. A semiconductor device manufacturing apparatus according to claim 1, wherein said semiconductor device manufacturing apparatus comprises a diffusion furnace.

7. A semiconductor device manufacturing apparatus according to claim 1, wherein said semiconductor device manufacturing apparatus comprises a vacuum vapor phase apparatus.

* * * * *